US011302640B2

(12) United States Patent
Seto et al.

(10) Patent No.: US 11,302,640 B2
(45) Date of Patent: Apr. 12, 2022

(54) SEMICONDUCTOR DEVICE

(71) Applicant: KIOXIA CORPORATION, Tokyo (JP)

(72) Inventors: Motoshi Seto, Yokohama Kanagawa (JP); Hitomi Kawaguchiya, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 15/909,450

(22) Filed: Mar. 1, 2018

(65) Prior Publication Data

US 2019/0088599 A1 Mar. 21, 2019

(30) Foreign Application Priority Data

Sep. 19, 2017 (JP) ............................. JP2017-178854

(51) Int. Cl.
| *H01L 23/532* | (2006.01) |
|---|---|
| *H01L 23/48* | (2006.01) |
| *H01L 25/065* | (2006.01) |
| *H01L 23/522* | (2006.01) |

(52) U.S. Cl.
CPC ........ *H01L 23/5329* (2013.01); *H01L 23/481* (2013.01); *H01L 23/5226* (2013.01); *H01L 25/0657* (2013.01); *H01L 2225/06513* (2013.01); *H01L 2225/06517* (2013.01)

(58) Field of Classification Search
CPC ....... H01L 2924/00014; H01L 21/7682; H01L 23/5226; H01L 23/5222; H01L 21/76877
See application file for complete search history.

(56) References Cited

U.S. PATENT DOCUMENTS

| 8,587,121 | B2 | 11/2013 | Koester et al. | |
|---|---|---|---|---|
| 8,742,590 | B2 | 6/2014 | Beyne | |
| 8,937,368 | B2 * | 1/2015 | Harada | .................. H01L 29/78 257/621 |
| 2008/0315367 | A1 * | 12/2008 | Murayama | ........ H01L 23/49827 257/621 |
| 2009/0121313 | A1 * | 5/2009 | Hashimoto | ......... H01L 21/7682 257/522 |
| 2011/0140235 | A1 * | 6/2011 | Oda | .................... H01L 23/5256 257/529 |
| 2013/0285057 | A1 * | 10/2013 | Ishii | ....................... H01L 24/05 257/48 |

(Continued)

Primary Examiner — Marcos D. Pizarro
Assistant Examiner — Quinton A Brasfield
(74) Attorney, Agent, or Firm — Kim & Stewart LLP

(57) ABSTRACT

According to one embodiment, a semiconductor device includes a semiconductor substrate having a first surface and a second surface opposite to the first surface, a first electrode extending in a first direction through the semiconductor substrate between the first surface and the second surface, a first wiring layer on the first surface and electrically connected to the first electrode, and a second wiring layer on the first wiring layer, the first wiring layer being between the semiconductor substrate and the second wiring layer in the first direction. The second wiring layer includes a connection region at which a second electrode is connected and a first air gap between the connection region and an outer edge of the second wiring layer in a second direction crossing the first direction.

20 Claims, 12 Drawing Sheets

(56) References Cited

U.S. PATENT DOCUMENTS

2014/0104474 A1* 4/2014 Tange ............... H01L 27/14685
                                                           348/308
2016/0351441 A1* 12/2016 Tsukiyama ............ H01L 23/481
2018/0033691 A1* 2/2018 You ..................... H01L 23/5222

* cited by examiner

# SEMICONDUCTOR DEVICE

CROSS-REFERENCE TO RELATED APPLICATION

This application is based upon and claims the benefit of priority from Japanese Patent Application No. 2017-178854, filed Sep. 19, 2017, the entire contents of which are incorporated herein by reference.

FIELD

Embodiments described herein relate generally to a semiconductor device.

BACKGROUND

A semiconductor device in which memory chips with through-silicon via (TSV) are stacked, is known.

DETAILED DESCRIPTION

Figure 1:
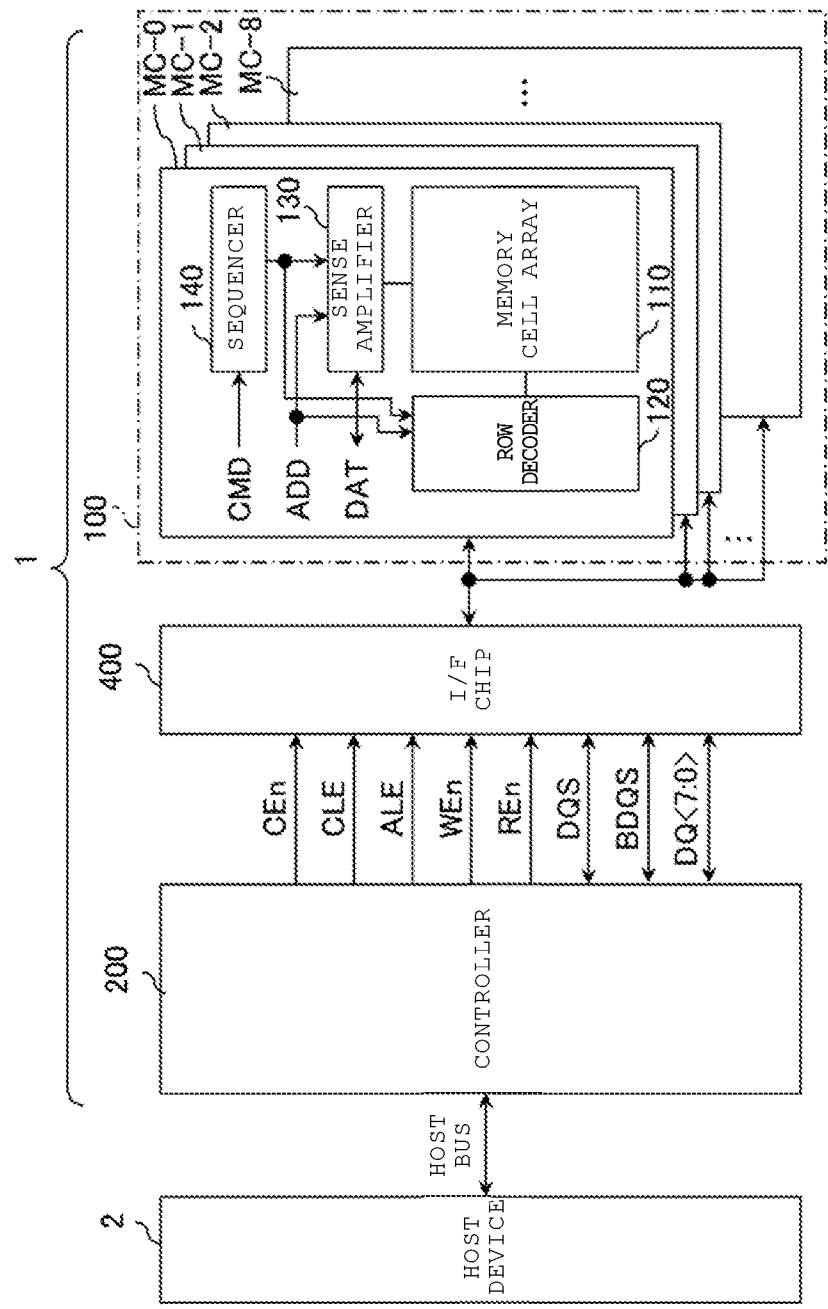
FIG. 1 is a block diagram of a memory system according to a first embodiment.

In general, according to one embodiment, a semiconductor device includes a semiconductor substrate having a first surface and a second surface opposite to the first surface, a first electrode extending in a first direction through the semiconductor substrate between the first surface and the second surface, a first wiring layer on the first surface and electrically connected to the first electrode, and a second wiring layer on the first wiring layer, the first wiring layer being between the semiconductor substrate and the second wiring layer in the first direction. The second wiring layer includes a connection region at which a second electrode is connected and a first air gap between the connection region and an outer edge of the second wiring layer in a second direction crossing the first direction.

Hereinafter, semiconductor devices according to example embodiments will be described with reference to the drawings. In the following description, substantially similar components are denoted by the same reference numerals and repeated description of these components in different embodiments may be omitted. In addition, the embodiments described below are shown as examples for illustrative purposes and the depicted materials, shapes, structures, arrangements, and the like are for example and not limitations.

1. First Embodiment

A semiconductor device according to a first embodiment will be described. In the following, a memory system including a NAND type flash memory will be described as an example of a semiconductor device.

1.1 Overall Configuration of Memory System

FIG. 1 is block diagram of a memory system according the first embodiment.

As shown in FIG. 1, the memory system 1 includes a storage medium 100, an interface (I/F) chip 400, and a controller 200. For example, one semiconductor memory device may include a combination of the controller 200 and the storage medium 100 may constitute. Examples of the semiconductor memory device include a memory card such as an SDTM card, a solid state drive (SSD), and the like.

The storage medium 100 includes a plurality of independent chips. In the present embodiment, a case where the chips are the NAND type flash memories will be described. Hereinafter, the chips will be referred to as "memory chips MC". In FIG. 1, the storage medium 100 includes eight memory chips MC-1 to MC-8. The number of memory chips provided in the storage medium 100 may be arbitrarily set. Details of the memory chip MC will be described below.

The interface (I/F) chip 400 transfers various signals between the controller 200 and the storage medium 100.

The controller 200 is connected with each memory chip MC of the storage medium 100 via the I/F chip 400 and manages a memory space of the storage medium 100. In response to an instruction received from a host device 2 via a host bus, the controller 200 instructs the storage medium 100 to perform a read operation, a write operation, an erasing operation of data, or the like.

The controller 200 transmits and receives signals to and from the storage medium 100 via the I/F chip 400. More specifically, the controller 200 transmits and receives an 8-bit signal DQ <7:0>, for example, to and from the storage medium 100. The signal DQ <7:0> includes, for example, data DAT, an address ADD, and a command CMD. The controller 200 transmits, for example, a chip enable signal CEn, a command latch enable signal CLE, an address latch enable signal ALE, a write enable signal WEn, and a read enable signal REn to the storage medium 100.

The signal CEn is a signal for enabling the corresponding memory chip MC and is asserted, for example, at a low level (hereinafter also referred to as "L" level). The signals CLE and ALE are signals indicating that signals DQ <7:0> are commands and addresses, respectively, and are asserted at a high level (hereinafter also referred to as "H" level), for example. The signal WEn is a signal for fetching the received signal into the memory chip MC and is asserted, for example, at the "L" level every time the signal DQ <7:0> is received from the controller 200. Therefore, every time the write enable signal WEn is toggled, the signal DQ <7:0> is fetched into the memory chip MC. The signal REn is a signal for the controller to read the data DAT from the memory chip MC. The read enable signal REn is asserted, for example, at the "L" level. Therefore, the memory chip MC outputs the signal DQ <7:0> to the controller 200 based on the toggled read enable signal REn.

A complementary signal BDQS of the signal DQS and the signal DQS are clock signals output from the transmission side together with the signal DQ <7:0> (data). The data receiving side receives the transmitted signal DQS and signal BDQS and adjusts a timing of fetching the data.

1.2 Configuration of Memory Chip

As shown in FIG. 1, each of the memory chips MC includes a memory cell array 110, a row decoder 120, a sense amplifier 130, and a sequencer 140.

The memory cell array 110 includes a plurality of non-volatile memory cells (not shown) associated with rows and columns. The memory cell array 110 stores data supplied from the controller 200.

The row decoder 120 decodes a row address. Based on the decoding result, the row decoder 120 selects a row direction in the memory cell array 110 and applies a necessary voltage.

The sense amplifier 130 selects a corresponding column based on a column address. When data is read, the sense amplifier 130 reads the data DAT from the memory cell array 110 and outputs the read data to the controller 200. When data is written, the sense amplifier 130 transfers the write data DAT received from the controller 200 to the memory cell array 110.

The sequencer 140 controls the operation of the entire memory chip MC based on the command CMD received from the controller 200.

The memory chip MC may be a planar NAND type flash memory including a memory cell array 110 in which memory cells are two-dimensionally arranged on a semiconductor substrate or may be a three-dimensional stacked NAND type flash memory including the memory cell array 110 in which memory cells are three-dimensionally arranged above the semiconductor substrate.

The configuration of the memory cell array 110 in the three-dimensional stacked NAND type flash memory is described, for example, in U.S. patent application Ser. No. 12/407,403, filed on Mar. 19, 2009, entitled "THREE DIMENSIONAL STACKED NONVOLATILE SEMICONDUCTOR MEMORY". In addition, the configuration thereof is described in U.S. patent application Ser. No. 12/406,524, filed Mar. 18, 2009, entitled "THREE DIMENSIONAL STACKED NONVOLATILE SEMICONDUCTOR MEMORY", U.S. patent application Ser. No. 12/679,991, filed Mar. 25, 2010, entitled "NON-VOLATILE SEMICONDUCTOR STORAGE DEVICE AND METHOD OF MANUFACTURING THE SAME", and U.S. patent application Ser. No. 12/532,030, filed Mar. 23, 2009, entitled "SEMICONDUCTOR MEMORY AND METHOD FOR MANUFACTURING SAME". These patent applications are incorporated herein by reference in their entirety.

1.3 Implementation of I/F Chip and NAND Type Flash Memory

Figure 2:
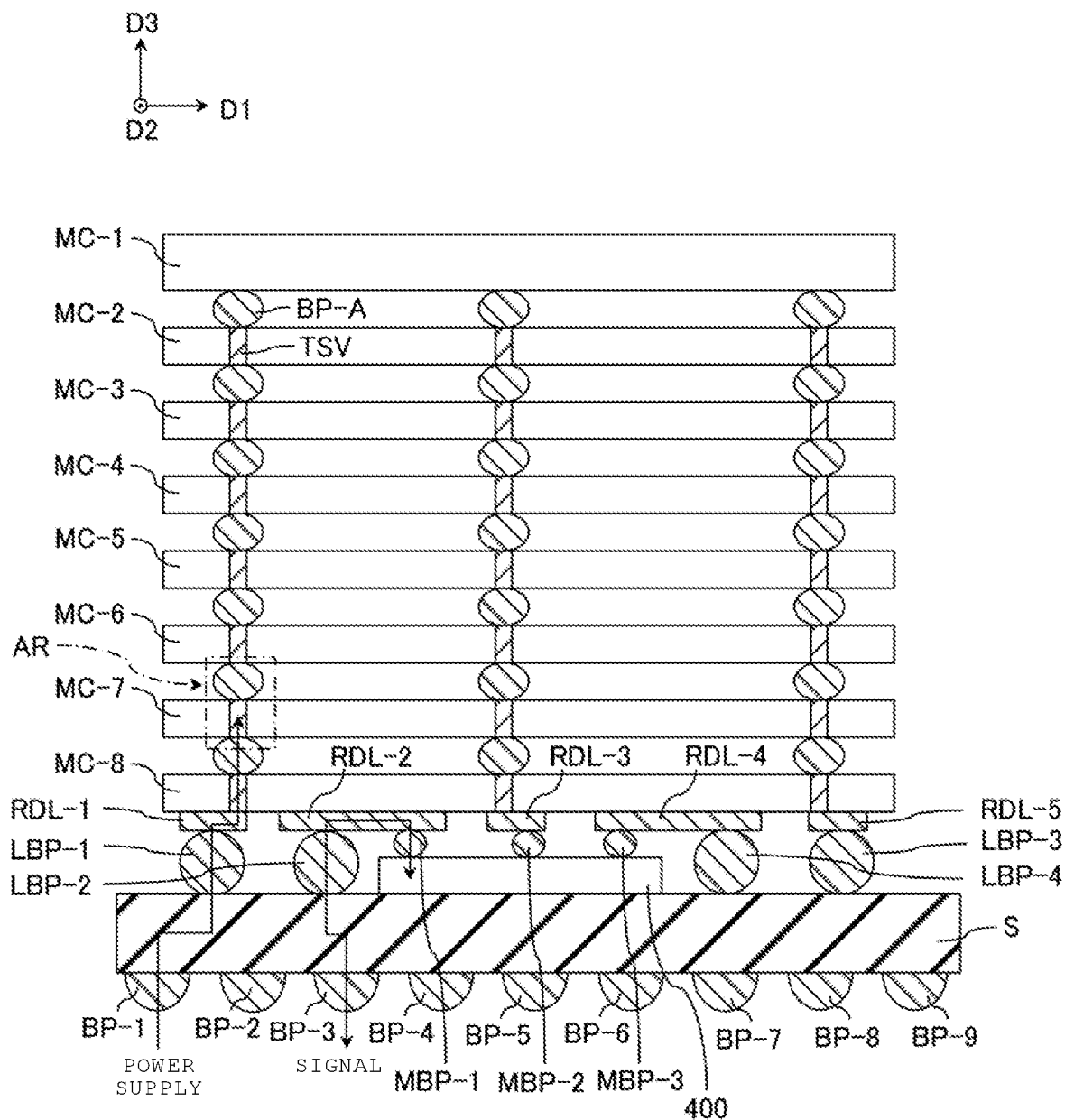
FIG. 2 is a cross-sectional view of memory chips and an interface chip in a memory system according to the first embodiment.

FIG. 2 is a cross-sectional view of the I/F chip 400 and the memory chips MC in the storage medium 100.

As shown in FIG. 2, the I/F chip 400 is mounted on a mounting board S. A plurality of large bumps LBPs (LBP-1 to LBP-4) are formed on an upper surface of the mounting substrate S. In addition, a plurality of micro-bumps MBPs (MBP-1 to MBP-3) are formed on an upper surface of the I/F chip 400. The large bump LBP and the micro-bump MBP are formed so that top surfaces of the large bump LBP and the micro-bump MBP are aligned and memory chips MCs (MC-1 to MC-8) can be stacked on the top surfaces.

A plurality of bumps BPs (BP-1 to BP-9) is formed on a lower surface of the mounting board S. The bump BP and the large bump LBP are electrically connected with each other through a wiring formed in the mounting board S. The bump BP is used for supplying a power supply voltage from the outside of the substrate S or to transmit and receive signals to and from the outside. For example, the bump BP-1 is used to supply a power supply voltage to the memory chips MC-1 to MC-8. For example, the bumps BP-2 to BP-9 are used for transmitting and receiving various signals between the controller 200 and the I/F chip 400 and the memory chip MC.

In FIG. 2, each of the memory chips MC is a planar NAND type flash memory including a two-dimensional memory cell array 110 arranged on a surface of a semiconductor substrate 10 (also referred to as a "chip surface"). The opposite surface of the semiconductor substrate 10 is referred to as a "chip rear surface." The plurality of memory chips MCs (MC-1 to MC-8) are stacked on the large bump LBP and the micro-bump MBP. The memory chips MC-1 to MC-8 are electrically connected with each other using electrodes TSV and a bump BP-A which electrically connect chip surfaces and chip rear surfaces of adjacent memory chips MC. This structure is referred to as a ball grid array (BGA) and used in device package systems with many input/output pins.

In FIG. 2, the bumps BP 1 to BP 9, the large bumps LBP-1 to LBP-4 and the micro-bumps MBP-1 to MBP-4 are shown. The total numbers of bumps BP, large bumps LBP and micro-bumps MBP may be arbitrarily set. The memory chips MC-1 to MC-8 may be mounted face-down so that the chip surface faces the substrate S. Alternatively, the memory chips MC-1 to MC-8 may be mounted face-up manner so that the chip rear surface faces the substrate S.

On the chip surface of the lowermost memory chip MC-8, the redistribution layer RDL (RDL-1 through RDL-5) are formed. The redistribution layers RDL connect the large bumps LBP formed on the substrate S and the electrodes TSV with each other. The redistribution layers RDL connect the large bumps LBP and the micro-bumps MBP with each other.

Specifically, for example, the bump BP-1 is connected to the electrode TSV of the memory chip MC-8 via the wiring in the substrate S, the large bump LBP-1, and the redistribution layer RDL-1, and is used for supplying power supply voltage. In addition, the bump BP-3 is connected to the I/F chip 400 via the wiring in the substrate S, the large bump LBP-2, the redistribution layer RDL-2, and the micro-bump MBP-1, and is used for transmission and reception of signals, for example. In addition, the I/F chip 400 is connected to the electrode TSV of the memory chip MC-8 via the micro-bump MBP-2 and the redistribution layer RDL-3.

The electrodes TSV are formed so as to pass through the memory chips MC-2 to MC-8. More specifically, the NAND type flash memory in the memory chip MC-1 is electrically connected to the electrode TSV of the memory chip MC-2 via the bump BP-A. The electrodes TSV of the memory chips MC-2 to MC-8 are electrically connected to the electrodes TSV of the other memory chips MC via the bumps BP-A.

1.4 Structure of Electrode TSV

Figure 3:
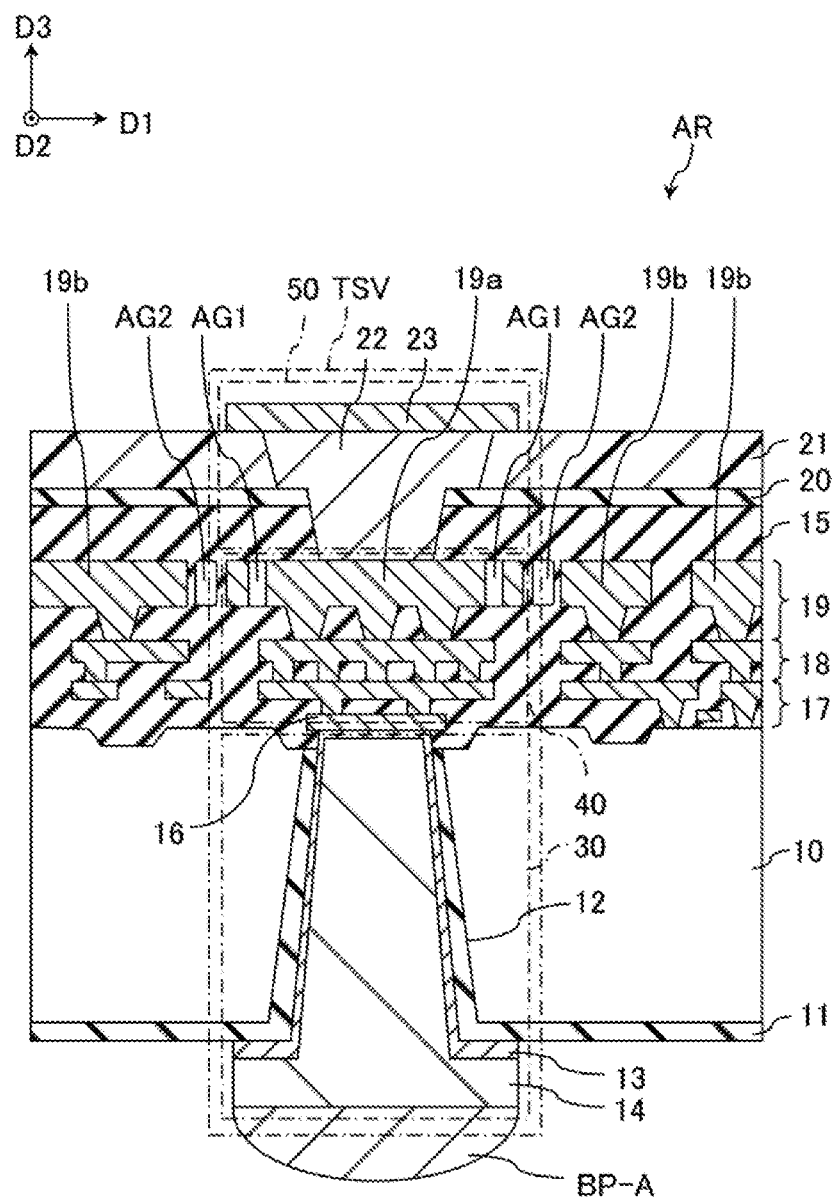
FIG. 3 is a cross-sectional view of a through-silicon via (TSV) electrode in a memory chip according to the first embodiment.

FIG. 3 is a cross-sectional view of the electrode TSV. In FIG. 3, the region AR in FIG. 2 is enlarged and the chip surface faces upward. In the example of FIG. 3, three wiring layers 17, 18, and 19 are formed above the semiconductor substrate 10. The number of wiring layers may be arbitrarily set.

As shown in FIG. 3, the electrode TSV typically includes a lower electrode 30, a wiring layer connection portion 40, and an upper electrode 50.

The lower electrode 30 connects a conductive layer 16 provided in an insulating layer 15 on the chip surface and the bump BP-A on the rear chip surface with each other. For the insulating layer 15, a silicon oxide film is used, for example. For the conductive layer 16, for example, metal silicide (nickel silicide, tungsten silicide or the like) is used. The conductive layer 16 has a function as an etching stopper when a through-hole 12 is formed in the semiconductor substrate 10. Therefore, the conductive layer 16 may be any metal such as tungsten functioning as an etching stopper or metal silicide. For the bump BP-A, solder is used, for example.

More specifically, a through-hole 12 penetrating the semiconductor substrate 10 and reaching the conductive layer 16 is formed, and an insulating layer 11 covers a side surface of the through-hole 12 and the chip rear surface. For the insulating layer 11, a silicon oxide film is used, for example. A barrier layer 13 is in contact with the conductive layer 16, the side surface of the through-hole 12, and the insulating layer 11 near an opening. For the barrier layer 13, titanium nitride or nickel nitride is used, for example. It should be noted that the barrier layer 13 is not limited to titanium nitride or nickel nitride. The barrier layer 13 may include a conductive material so long as the conductive material prevents reaction between the metal material of the conductive layer 14 and the conductive layer 16 or the insulating layer 11. Furthermore, the conductive layer 14 is formed on the barrier layer 13 to fill the inside of the through-hole 12 and to protrude from the rear surface of the chip in the vicinity of the opening of the through-hole 12. For the conductive layer 14, copper is used, for example. Alternatively, a conductive material other than copper may be used for the conductive layer 14. The bump BP-A is provided on the protruding conductive layer 14.

The wiring layer connection portion 40 includes a plurality of wiring layers 17 to 19 formed above the semiconductor substrate 10. The wiring layer connection portion 40 connects the lower electrode 30 and the upper electrode 50 with each other. The upper electrode 50 is provided along a third direction D3 perpendicular to the semiconductor substrate 10 via the conductive layer 16. The wiring layer connection portion 40 connects the NAND type flash memory formed on the semiconductor substrate 10 and the electrode TSV with each other.

On the semiconductor substrate 10, the wiring layers 17 to 19 constituting a circuit such as the NAND type flash memory are formed in the insulating layer 15 on the semiconductor substrate 10. While a part of elements and wirings used in the NAND type flash memory is shown in the example of FIG. 3, detailed description on the respective elements and the wirings will be omitted. Each of the wiring layers 17 to 19 includes a wiring portion and a via portion for electrically connecting with a lower wiring layer, the semiconductor substrate 10, or the like. The wiring portion and the via portion may collectively formed using the same material, or the wiring portion and the via portion may be formed by separate processes using different materials. For the wiring layers 17 to 19, for example, a conductive material such as tungsten, aluminum or copper is used, and for barrier layers (not shown) of the wiring layers 17 to 19, titanium nitride, nickel nitride, or the like is used. The barrier layer may include a conductive material and can prevent reaction between the wiring layers 17 to 19 and the insulating layer 15.

In the example embodiments described below, aluminum is used for the wiring layer 19. The wiring layer 19 that is directly in contact with the upper electrode 50 (that is, conductive layer 22) as the wiring layer connection portion 40 will be referred to as a wiring layer 19a. The wiring layer 19 which constitutes a circuit such as the NAND type flash memory and is not directly in contact with the conductive layer 22 will be referred to as a wiring layer 19b.

In the wiring layer connection portion 40 according to the present embodiment, an air gap AG1 on a slit is provided in a wiring portion of the uppermost wiring layer 19a. In addition, an air gap AG2 is provided between the wiring layer 19a and the adjacent wiring layer 19b. The layout of the air gaps AG1 and AG2 will be described later.

In FIG. 3, the cross-sectional shapes of the air gaps AG1 and AG2 are substantially rectangles. It should be noted that the cross-sectional shapes thereof are not limited. For example, the cross-sectional shapes thereof may be substantially triangles, trapezoids, or circles, depending on the formation method of the air gaps AG1 and AG2. Further, although the air gap AG1 passes through the wiring layer 19a, the wiring layer 19a may be provided under the air gap AG1 instead. In the example embodiments described herein, the air gap AG1 is provided in the uppermost wiring layer 19a. It should be noted that the air gap AG1 may be provided in the lower wiring layer 17 or the lower wiring layer 18.

The upper electrode 50 is connected with the upper surface of the wiring layer 19 and an upper electrode pad 23 provided on the protection film 21.

A via is formed to pass through the insulating layer 15, a passivation film 20, and a protection film 21 and to reach the upper surface of the wiring layer 19. The conductive layer 22 is filled inside the via. For the conductive layer 22, nickel is used, for example. For the conductive layer 22, a conductive material other than nickel may be used. For the passivation film 20, a silicon oxide film or a silicon nitride film is used, for example. For the protection film 21, a resin such as PET (polyethylene terephthalate) or polyimide is used, for example. The upper electrode pad 23 is provided on the upper surface of the conductive layer 22 and on a part of the protection film 21. For the upper electrode pad 23, gold is used, for example.

1.5 Layout of Air Gaps AG1 and AG2

Figure 4:
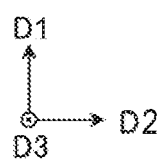
FIG. 4 is a plan view of a wiring layer of a memory chip according to the first embodiment.
Figure 4:
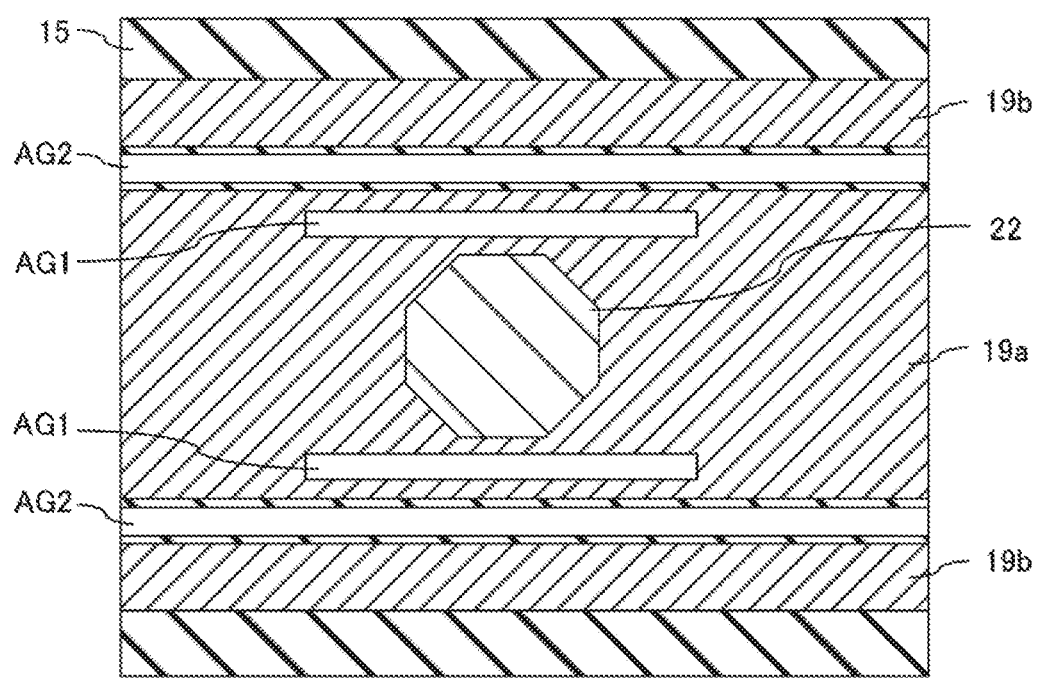

FIG. 4 is a top view of the wiring layer 19.

As shown in FIG. 4, the wiring layer 19a extends in a second direction D2 which is parallel to the semiconductor substrate 10. The wiring layer 19a functions as the wiring layer connection portion 40 and has a relatively wide wiring width. The conductive layer 22 functioning as the upper electrode 50 of the electrode TSV is in contact with the upper surface of the wiring layer 19a. The linear air gap AG 1 is provided between a connection region with the conductive layer 22 and an end portion of the wiring layer 19a in a first direction D1 which is parallel to the semiconductor substrate 10 and is orthogonal to the second direction D2. The width of the air gap AG1 in the first direction D1 (for example, 0.2 µm or less) is set such that the air gap AG1 is formed without being filled when the insulating layer 15 is formed on the wiring layer 19. The length of the air gap AG1 in the second direction D2 may be arbitrarily set. A plurality of linear air gaps AG1 maybe provided between the connection region with the conductive layer 22 and the end portion of the wiring layer 19a. The insulating layer 15 may be formed on a side surface of the air gap AG1.

The wiring layers 19b extending in the second direction D2 are provided at both ends of the wiring layer 19a in the first direction D1, and the linear air gap AG2 are provided between the wiring layer 19a and the wiring layers 19b. The width of the air gap AG2 in the first direction D1 is set such that the air gap AG2 is formed without being filled when the insulating layer 15 is formed on the wiring layer 19. Although the insulating layer 15 is formed between the air gap AG2 and the wiring layer 19, the insulating layer 15 may be omitted.

1.6 Formation Method of Air Gaps

Figure 5:
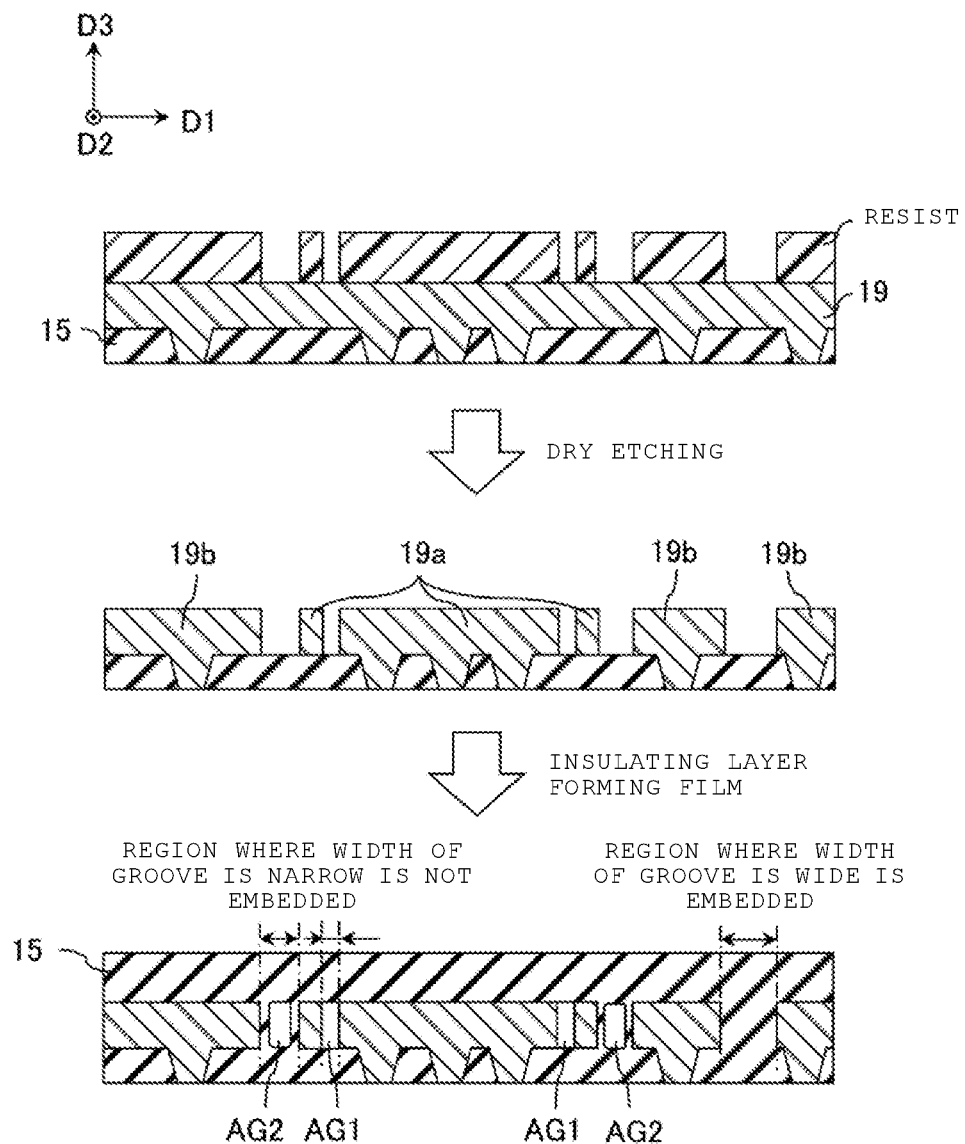
FIG. 5 is a cross-sectional view of a wiring layer during a manufacturing process according to the first embodiment.

FIG. 5 is a cross-sectional view of the wiring layer 19 during a manufacturing process. In FIG. 5, aluminum is used for the wiring layer 19.

As shown in FIG. 5, after the via of the wiring layer 19 is opened in the insulating layer 15, a barrier layer of aluminum is formed on the insulating layer 15 by a sputtering method, for example. Thereafter, a resist pattern is formed using a lithography technique.

Next, a barrier layer of aluminum is processed by using dry etching technology to form the wiring layers 19a and 19b. Here, a groove pattern serving as the air gap AG1 is formed at the same time. When the groove pattern of the air gap AG1 is formed, aluminum of the lower wiring layer 19 may be left.

Next, the insulating layer 15 is formed by CVD, for example. At this time, depending on the filling characteristics (also referred to as a step coverage) of the insulating layer 15 by CVD, a region where a width of a groove between the adjacent wiring layers 19 is wide is filled with the insulating layer 15, and a region where the width of the groove is narrow is not filled with the insulating layer 15 and the air gap AG is formed. Accordingly, when the air gaps AG 1 and AG 2 are formed, considering the filling characteristics of the insulating layer 15, the groove widths are made large enough to not fill the grooves. At this time, the thickness of the insulating layer 15 formed on the side surfaces of the air gap AG2 and the air gap AG1 is determined by the widths of the grooves and the filling characteristics of the insulating layer 15. As the width of the groove increases, the thickness of the insulating layer 15 on the side surface increases. To prevent hillocks from being formed on the side surface of the wiring layer 19a (that is, in the air gap AG2), it is preferable that the thickness of the insulating layer 15 formed on the side surface of the air gap AG1 is smaller than the thickness of the insulating layer 15 which is formed on the side surface of the air gap AG2.

1.7 Effects According to the Present Embodiment

With the configuration according to the present embodiment, the reliability of the semiconductor device can be improved. Hereinafter, this effect will be described in detail.

Figure 6:
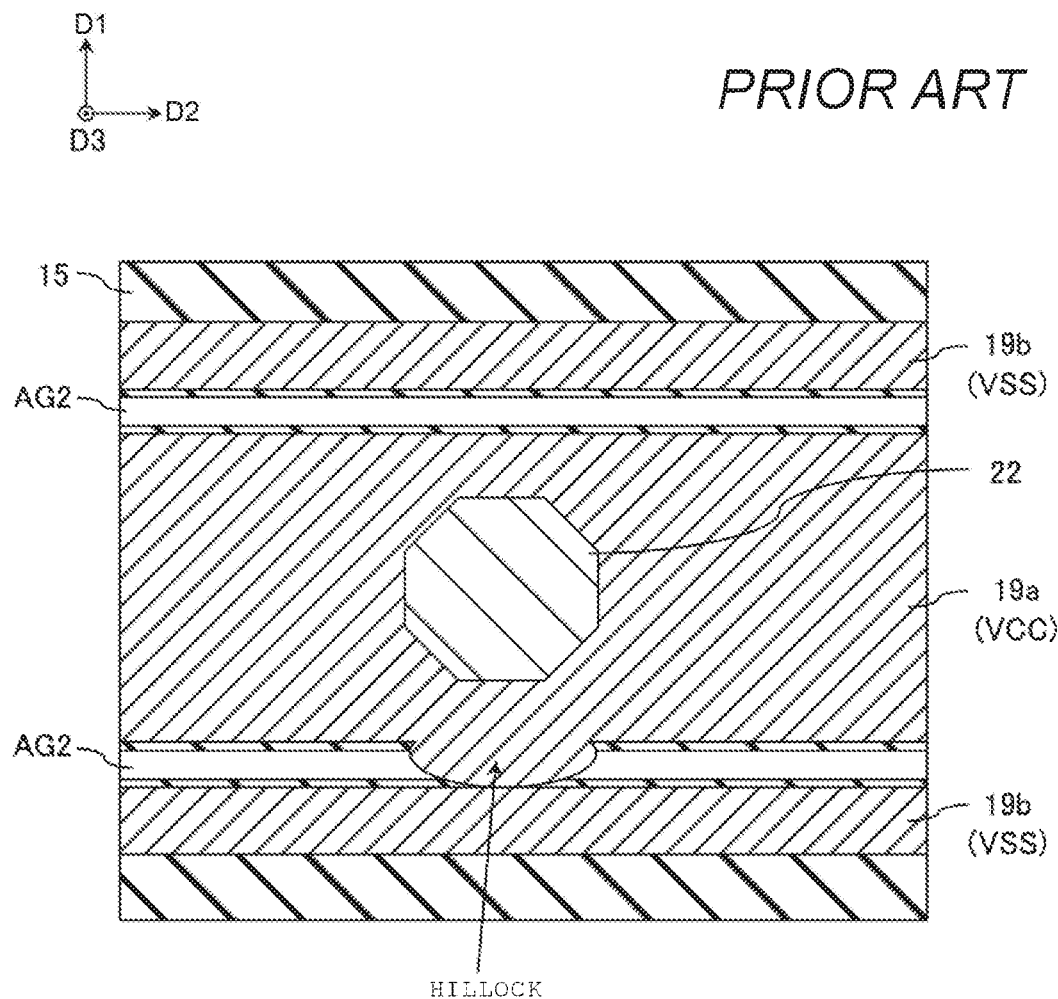
FIG. 6 is depicts an example of a short circuit between wirings.

Various thermal stresses occur in the memory system 1 according to the temperature change of an operating environment. For example, in the memory chip MC stacked using the electrode TSV, the wiring is wide and hillocks are likely to be formed due to stress migration in the wiring layer 19a to which stress is applied by the electrode TSV. FIG. 6 is a top view of the wiring layer 19a not having the air gap AG 1. In this case, hillocks are likely to be formed on the side surface of the wiring layer 19a, that is, in the air gap AG 2. If a power supply voltage VCC is applied to the wiring layer 19a and a ground voltage VSS is applied to the adjacent wiring layer 19b, the wiring layer 19a and the wiring layer 19b are electrically connected by hillocks and there is a possibility that a short circuit occurs between VCC and VSS.

With the configuration according to the present embodiment, the air gap AG1 can be formed in the vicinity of the connection region of the electrode TSV with the upper electrode 50. Accordingly, if aluminum in the wiring layer 19a flows due to stress caused by the electrode TSV, aluminum can flow in the air gap AG1 to relieve stress. Therefore, it is possible to prevent the formation of hillocks which penetrate the air gap AG2 and reach the wiring layer 19b on the side surface of the wiring layer 19a. Therefore, it is possible to prevent the short circuit between the wirings and to improve the reliability of the semiconductor device.

Furthermore, with the configuration according to the present embodiment, by forming the air gap AG1 in the wiring layer 19a having a wide wiring width, for example, an upper limit value of the wiring width for preventing hillocks can be relaxed. Therefore, the layout design of the wiring layer 19 is facilitated.

Furthermore, with the configuration according to the present embodiment, the air gap AG2 can be formed between the wiring layer 19a and the wiring layer 19b. Accordingly, the capacitance between wirings can be reduced.

Furthermore, with the configuration according to the present embodiment, by forming the air gap AG2, it is possible to reduce the capacitance between wirings and to reduce the wiring interval between the wiring layer 19a and the wiring layer 19b. Therefore, an increase in chip region can be prevented.

2. Second Embodiment

A second embodiment will be described. In the second embodiment, six specific examples of the layout of the wiring layer 19 will be shown. The same reference numerals are used for the components that are substantially the same as those of the first embodiment, and the description of repeated components may be omitted.

2.1 First Example

Figure 7:
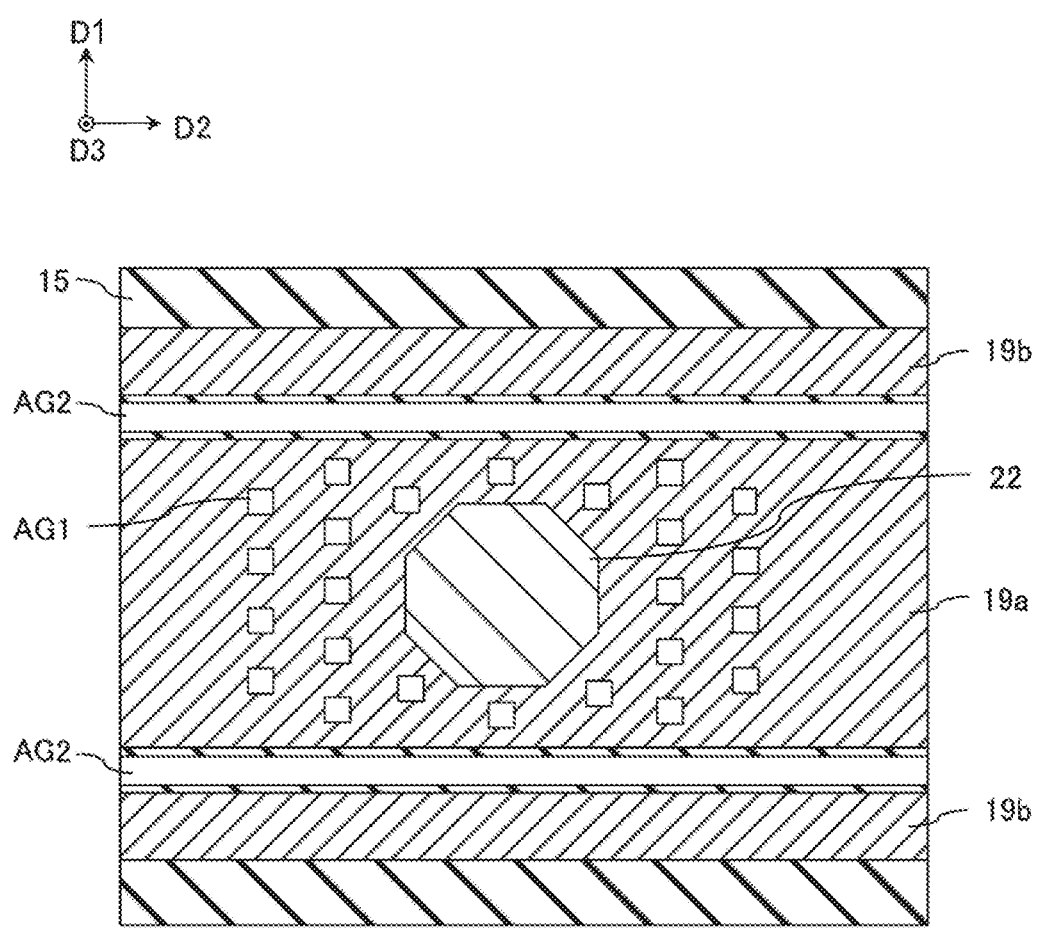
FIG. 7 is a plan view of a wiring layer of a memory chip according to a first example of a second embodiment.

FIG. 7 is a top view of the wiring layer 19 according to a first example. In the first example, column-shaped air gaps AG1 (hereinafter referred to as "dot shapes") are formed instead of the linear air gaps AG1 which has been described in FIG. 4. In the following description, the dot-shaped air gap AG1 has a square shape as viewed from above. It should be noted that the shape of the dot-shaped air gap AG1 is not limited to square. The shape as viewed from above may be rectangle, circle, or polygon.

As shown in FIG. 7, the dot-shaped air gaps AG1 in a staggered arrangement are provided in a peripheral region of the connection region (that is, the electrode TSV) with the conductive layer 22. The number of air gaps AG1 provided in the peripheral region of the electrode TSV, the distance between the air gaps AG1, and the like may be arbitrarily set.

2.2 Second Example

Figure 8:
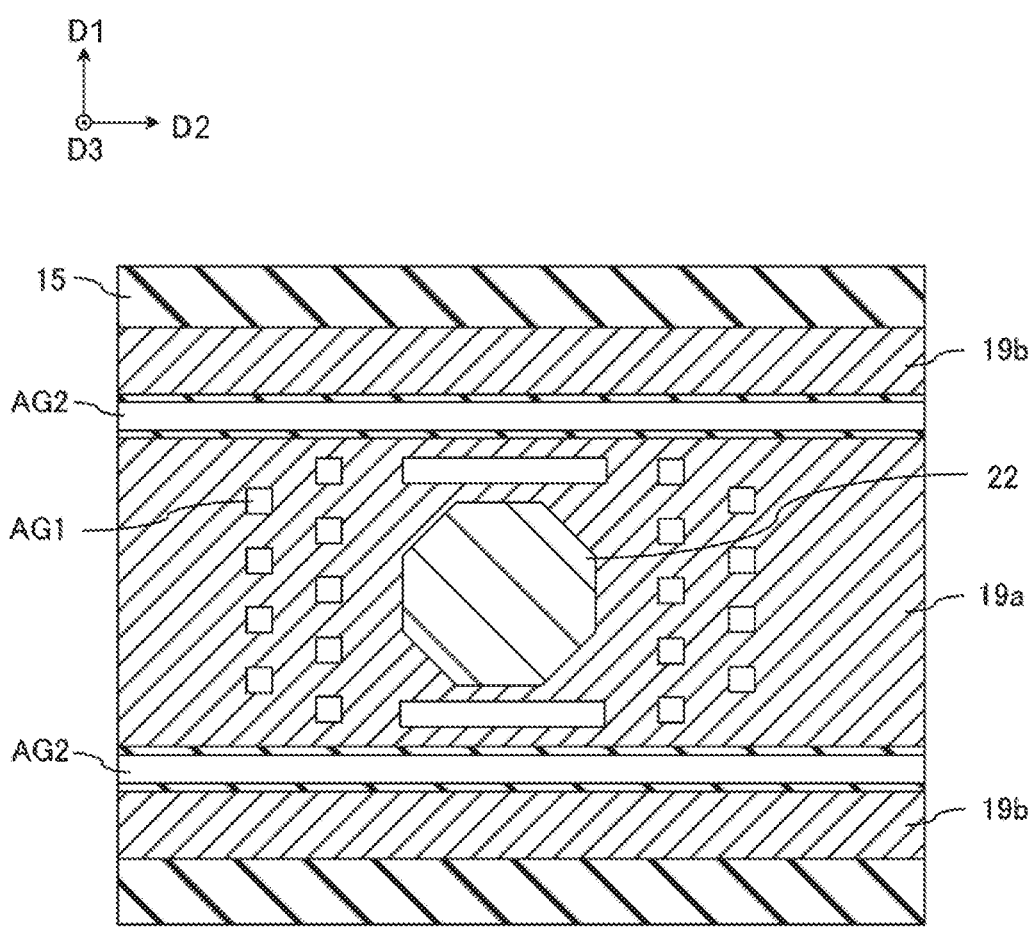
FIG. 8 is a plan view of a wiring layer of a memory chip according to a second example of the second embodiment.

FIG. 8 is a top view of the wiring layer 19 according to a second example. The second example includes linear air gaps AG1 in FIG. 4 and the dot-shaped air gaps AG1 combined.

As shown in FIG. 8, linear air gaps AG1 are provided in a peripheral region outside the connection region in the second direction D2, that is, between the connection region and the end portion of the wiring layer 19a. Dot-shaped air gaps AG1 in a staggered arrangement are provided in a peripheral region in the first direction D1 with respect to the electrode TSV. The number of air gaps AG1 provided in the peripheral region of the electrode TSV, the distance between the air gaps AG1, and the like may be arbitrarily set.

2.3 Third Example

Figure 9:
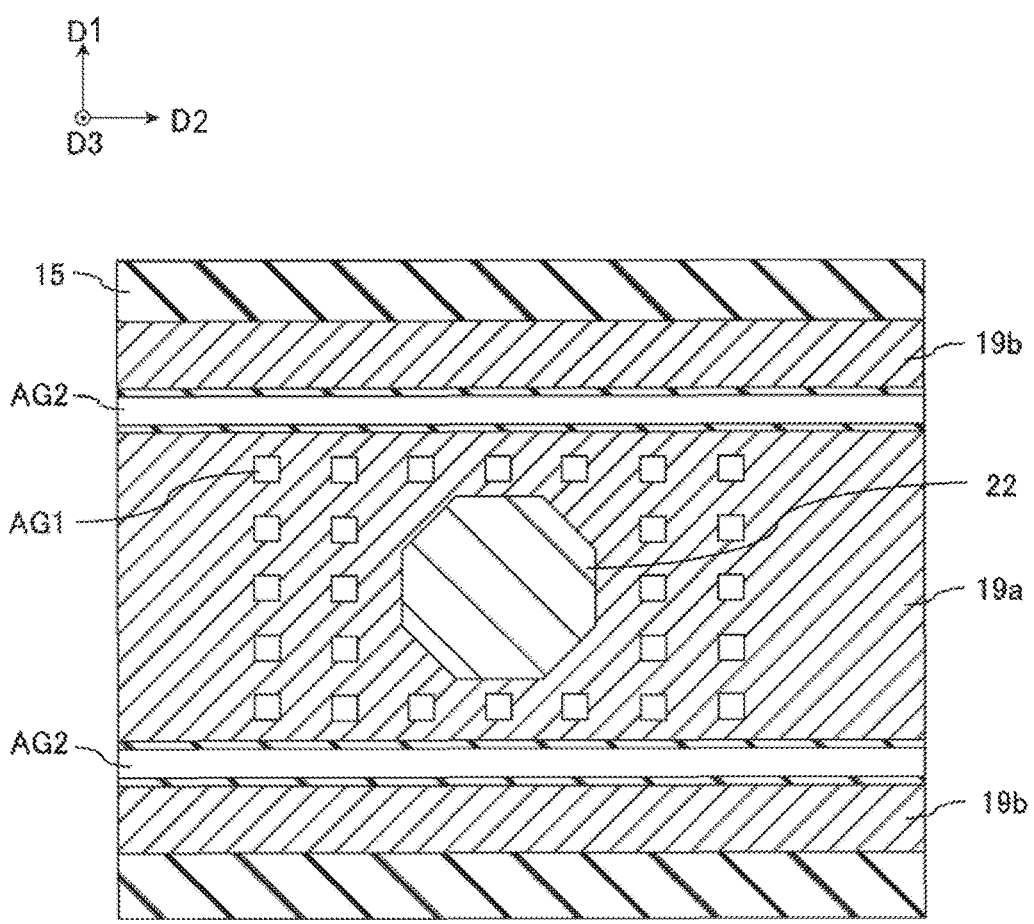
FIG. 9 is a plan view of a wiring layer of a memory chip according to a third example of the second embodiment.

FIG. 9 is a top view of the wiring layer 19 according to a third example.

As shown in FIG. 9, dot-shaped air gaps AG1 are arranged in a matrix form along the first direction D1 and the second direction D2 in the peripheral region of the electrode TSV. The number of air gaps AG1 provided in the peripheral region of the electrode TSV, the distance between the air gaps AG1, and the like may be arbitrarily set.

2.4 Fourth Example

Figure 10:
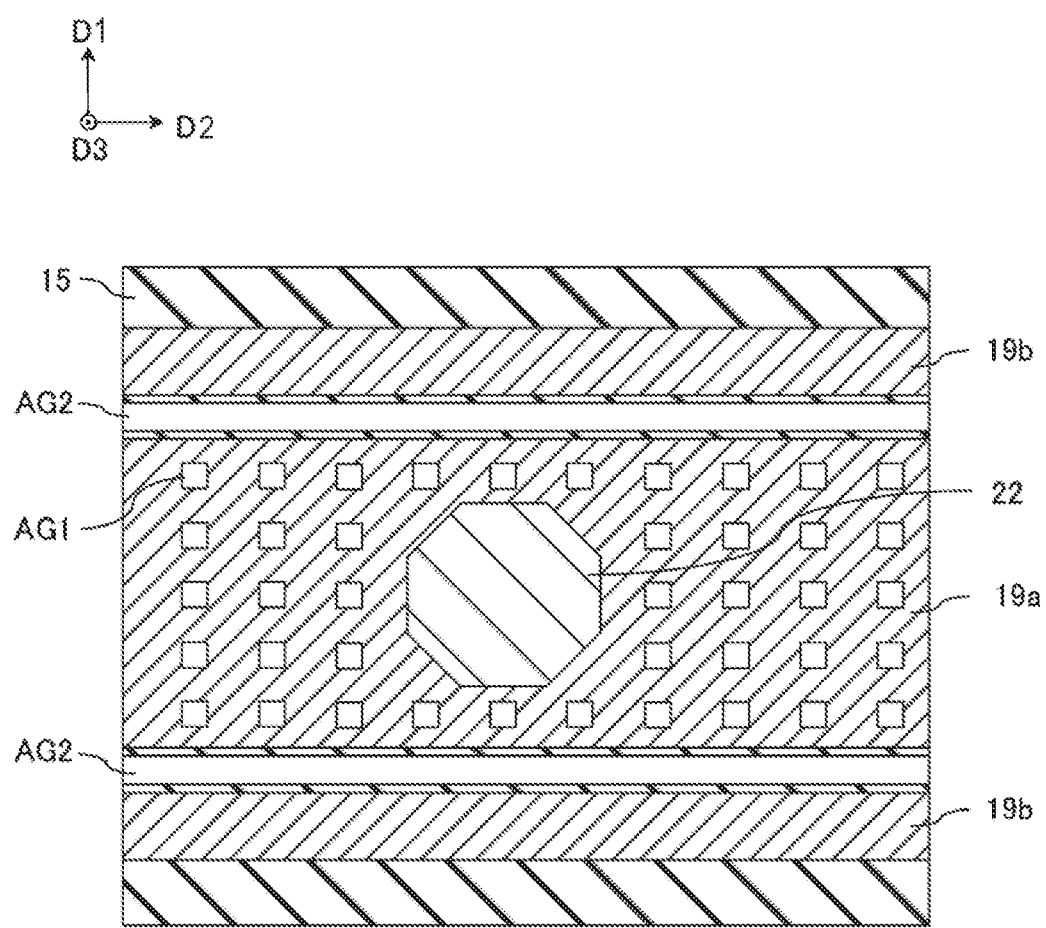
FIG. 10 is a plan view of a wiring layer of a memory chip according to a fourth example of the second embodiment.

FIG. 10 is a top view of the wiring layer 19 according to a fourth example.

As shown in FIG. 10, dot-shaped air gaps AG1 arranged in a matrix form are provided in the entire wiring layer 19a. The distance between the air gaps AG1 and the like may be arbitrarily set.

2.5 Fifth Example

Figure 11:
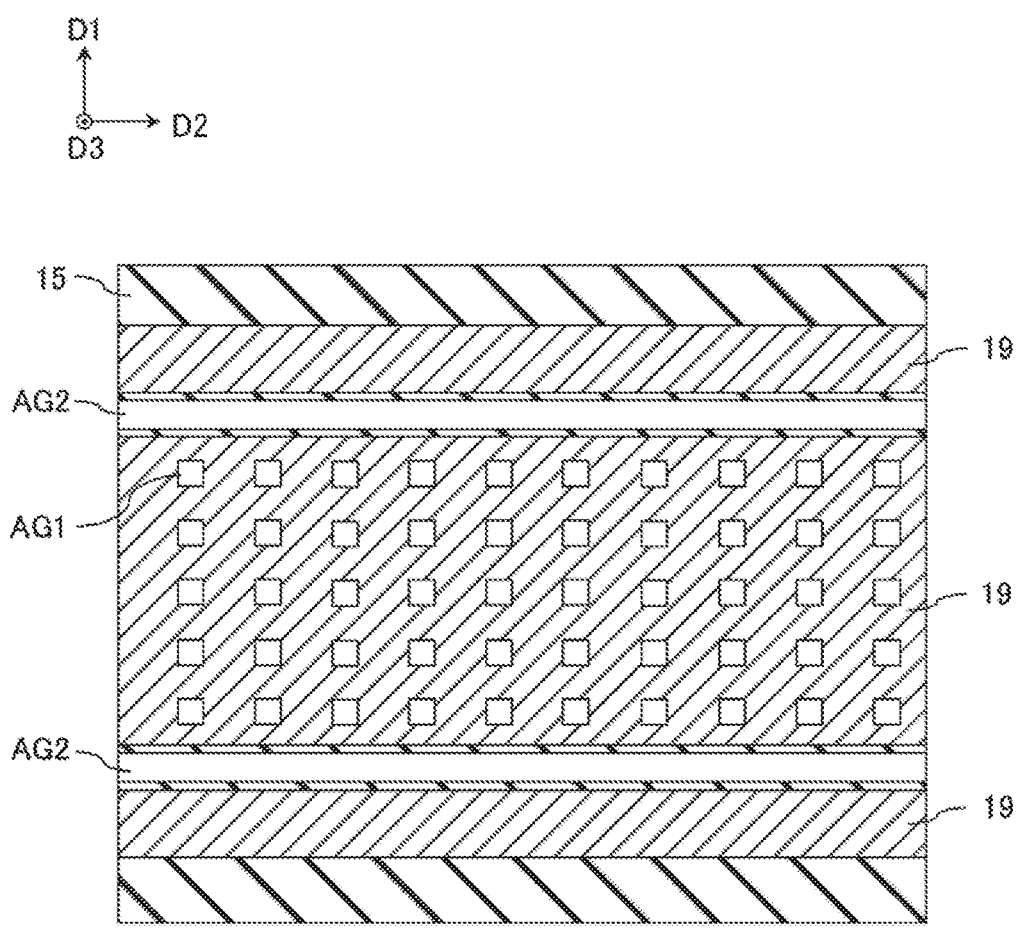
FIG. 11 is a plan view of a wiring layer of a memory chip according to a fifth example of the second embodiment.

FIG. 11 is a top view of the wiring layer 19 according to a fifth example.

As shown in FIG. 11, regardless of presence or absence of the electrode TSV, dot-shaped air gaps AG1 arranged in a matrix form are provided over the entirety of the wiring layer 19 having a relatively large wiring width. The wiring width of the wiring layer 19 in which the air gaps AG1 are provided, the distance between the air gaps AG1, and the like may be arbitrarily set. For example, if the wiring width of the wiring layer 19 is equal or to larger than a setting value, a design tool may automatically insert the dot shape of the air gap AG1 into the mask pattern of the wiring layer 19.

2.6 Sixth Example

Figure 12:
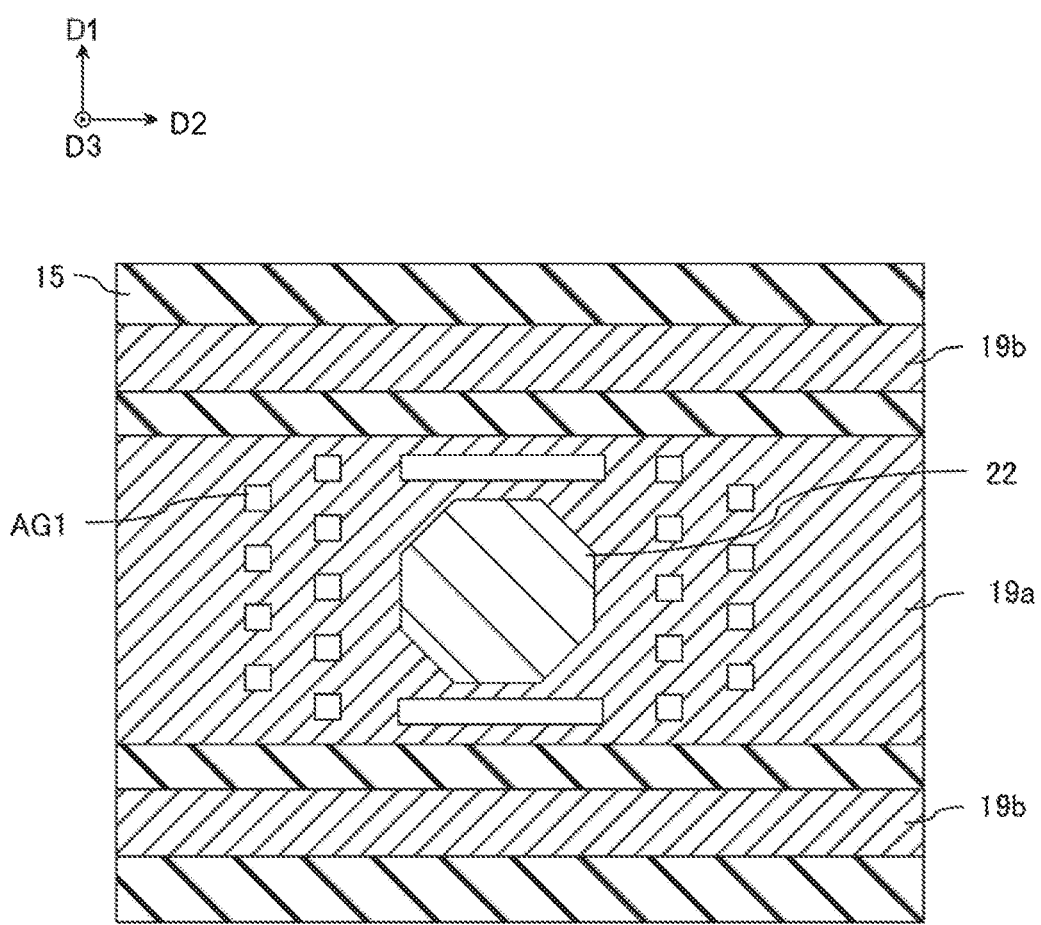
FIG. 12 is a plan view of a wiring layer of a memory chip according to a sixth example of the second embodiment.

FIG. 12 is a top view of the wiring layer 19 according to a sixth example.

As shown in FIG. 12, the air gap AG2 in FIG. 8 of the second example may be eliminated.

2.7 Regarding Effects of the Present Embodiment

The present embodiment is applicable to the first embodiment. Thereby, the same effect as in the first embodiment is achieved.

Furthermore, with the configuration according to the fifth example, it is possible to provide the air gaps AG1 over the entirety of the wiring layer 19 having the relatively wide wiring width. Accordingly, if the wiring width of the wiring layer 19 is equal to or larger than the setting value during the layout design of the wiring layer 19, the air gap AG1 can be automatically inserted. Therefore, the wiring layer 19 having the wider wiring width than the upper limit value of the design rule can be provided, and thus the design thereof is further facilitated.

3. Modification Examples and Variations

The semiconductor device according to the example embodiments described above includes a semiconductor substrate (10) that has first and second main surfaces opposed to each other, first and second wiring layers (18 and 19) being stacked on the first main surface; a first electrode (30) that is provided in the semiconductor substrate and electrically connects the first wiring layer on the first main surface and a terminal (BP-A) provided on the second main surface with each other; and a second electrode (50) that is provided on the second wiring layer. The first electrode, the first and second wiring layers, and the second electrode are arranged along a first direction (D3) perpendicular to the first and second main surfaces. The second wiring layer has a first air gap (AG1) between a connection region with the second electrode and an end portion of the second wiring layer.

By applying the above embodiment, it is possible to provide a semiconductor device that can improve reliability. It should be noted that the embodiments are not limited to those described above, and various modifications may be made.

For example, the embodiments described above can be combined as much as possible. For example, a combination of the first embodiment and the third example of the second embodiment may be combined so that the linear air gaps AG1 and the dot-shaped air gaps AG1 arranged in the matrix form are provided.

Furthermore, the embodiments described above are not limited to a semiconductor memory device using a NAND type flash memory, but may be applied to a semiconductor memory device using another memory. Furthermore, the embodiments may not have a memory and are applicable to a semiconductor device on which chips are stacked using an electrode TSV.

Furthermore, the term "adjacent" in the embodiments described above also includes a state where an interlayer insulating film or something else having insulating properties such as an air gap is interposed between objects in interest to achieve the indirect adjacent arrangement, for example.

Furthermore, the term "connection (connect)" in the embodiments described above also includes a state where a transistor, a resistor, or the like is interposed between objects in interest to achieve the indirectly connection between the objects, for example.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device, comprising:
  a semiconductor substrate having a first surface and a second surface opposite to the first surface; and a through-silicon via (TSV) provided through the semiconductor substrate, the TSV comprising:
  a first electrode provided on a first end of the TSV facing a first side of the semiconductor device and extending in a first direction through the semiconductor substrate between the first surface and the second surface;
  a first wiring layer on the first surface and electrically connected to the first electrode;
  a second wiring layer on the first wiring layer, the second wiring layer including a connection region, the first wiring layer being between the semiconductor substrate and the second wiring layer in the first direction; and
  a second electrode provided on a second end of the TSV facing a second side of the semiconductor device opposite to the first side and electrically connected to the connection region, wherein
  the second wiring layer includes a first air gap between the connection region and an outer edge of the second wiring layer in a second direction crossing the first direction and extending along the first surface of the semiconductor substrate, the first air gap extending in a third direction crossing the first and second directions and extending along the first surface of the semiconductor substrate, wherein the first air gap does not surround any part of the second wiring layer.

2. The semiconductor device according to claim 1, further comprising:
  a bump on the second surface, wherein
  the bump is electrically connected to the first wiring layer via the first electrode.

3. The semiconductor device according to claim 1, wherein the second wiring layer extends in the third direction.

4. The semiconductor device according to claim 1, further comprising:
  a third wiring layer adjacent to the second wiring layer in the second direction, the third wiring layer and the second wiring layers being in a same plane parallel to the first and second surfaces, wherein
  a second air gap that extends in the third direction is provided between the outer edge of the second wiring layer and an outer edge of the third wiring layer in the second direction.

5. The semiconductor device according to claim 4, wherein a width of the first air gap in the second direction is less than a width of the second air gap in the second direction.

6. The semiconductor device according to claim 1, wherein the second wiring layer further includes a plurality of first air gaps between the connection region and outer edges of the second wiring layer.

7. The semiconductor device according to claim 6, wherein the plurality of first air gaps is disposed in lines along the third direction.

8. A semiconductor device, comprising:
  a semiconductor substrate having a first surface and a second surface opposite to the first surface; and
  a through-silicon via (TSV) provided through the semiconductor substrate, the TSV comprising:
  a first electrode provided on a first end of the TSV facing a first side of the semiconductor device and extending in a first direction through the semiconductor substrate between the first surface and the second surface;
  a first wiring layer on the first surface and electrically connected to the first electrode;
  a second wiring layer on the first wiring layer, the second wiring layer including a connection region, the first wiring layer being between the semiconductor substrate and the second wiring layer in the first direction; and
  a second electrode provided on a second end of the TSV facing a second side of the semiconductor device opposite to the first side and electrically connected to the connection region, wherein
  the second wiring layer includes a plurality of first air gaps between the connection region and an outer edge of the second wiring layer in a second direction crossing the first direction and extending along the first surface of the semiconductor substrate, and
  none of the first air gaps surrounds any part of the second wiring layer.

9. The semiconductor device according to claim 8, further comprising:
  a bump on the second surface, wherein
  the bump is electrically connected to the first wiring layer via the first electrode.

10. The semiconductor device according to claim 8, further comprising:
  a third wiring layer adjacent to the second wiring layer in the second direction, the third wiring layer and the second wiring layers being in a same plane parallel to the first and second surfaces, wherein
  a second air gap, which extends in a third direction crossing the first and second directions and extending along the first surface of the semiconductor substrate, is provided between the outer edge of the second wiring layer and an outer edge of the third wiring layer in the second direction.

11. The semiconductor device according to claim 8, wherein the second wiring layer extends in a third direction crossing the first direction and the second direction.

12. The semiconductor device according to claim 11, wherein
  at least one first air gap of the plurality of first air gaps extends in the third direction, and
  remaining first air gaps of the plurality of first air gaps are disposed between the connection region and the outer edge of the second wiring layer in a staggered arrangement along the third direction.

13. The semiconductor device according to claim 11, wherein
  at least one first air gap of the plurality of first air gaps extends in the third direction, and
  remaining first air gaps of the plurality of first air gaps are disposed between the connection region and the outer edge of the second wiring layer in lines along the third direction.

14. The semiconductor device according to claim 8, wherein the plurality of first air gaps are disposed in a region surrounding the connection region in a plane parallel to the second wiring layer.

15. The semiconductor device according to claim 14, wherein at least one first air gap in the plurality of first air gaps extends longitudinally along a third direction parallel to the second wiring layer for a distance that is greater than a width of the at least one first air gap in the second direction.

16. A semiconductor device, comprising:
  a mounting board;
  an interface chip on the mounting board;

a plurality of semiconductor chips stacked on the mounting board and the interface chip, each of the semiconductor chips including:
- a semiconductor substrate having a first surface and a second surface opposite to the first surface; and
- a through-silicon via (TSV) provided through the semiconductor substrate, the TSV comprising:
  - a first electrode provided on a first end of the TSV facing a first side of the semiconductor chip and extending in a first direction through the semiconductor substrate between the first surface and the second surface;
  - a first wiring layer on the first surface and electrically connected to the first electrode;
  - a second wiring layer on the first wiring layer, the second wiring layer including a connection region, the first wiring layer being between the semiconductor substrate and the second wiring layer in the first direction; and
  - a second electrode provided on a second end of the TSV facing a second side of the semiconductor chip opposite to the first side and electrically connected to the connection region, wherein
  - the second wiring layer includes a first air gap between the connection region and an outer edge of the second wiring layer in a second direction crossing the first direction and extending along the first surface of the semiconductor substrate, the first air gap extending in a third direction crossing the first and second directions and extending along the first surface of the semiconductor substrate, wherein the first air gap does not surround any part of the second wiring layer.

17. The semiconductor device according to claim 16, further comprising:
- a bump between an adjacent pair of semiconductor chips in the plurality of semiconductor chips, the bump electrically connecting the first electrode of one semiconductor substrate in the pair to the second electrode of the second wiring layer of the other semiconductor substrate in the pair.

18. The semiconductor device according to claim 16, wherein at least one semiconductor chip in the plurality of semiconductor chips further comprises:
- a plurality of first air gaps in the second wiring layer, the plurality of first air gaps between the connection region and outer edges of the second wiring layer.

19. The semiconductor device according to claim 16, wherein each of the semiconductor chips further includes:
- a third wiring layer adjacent to the second wiring layer in the second direction, the third wiring layer and the second wiring layers being in a same plane parallel to the first and second surfaces, wherein
- a second air gap that extends in the third direction is provided between the outer edge of the second wiring layer and an outer edge of the third wiring layer in the second direction, and
- a width of the first air gap in the second direction is less than a width of the second air gap in the second direction.

20. The semiconductor device according to claim 19, wherein a width of the first air gap in the second direction is less than a width of the second air gap in the second direction.

* * * * *